United States Patent

Funaki

[11] Patent Number: 6,046,530
[45] Date of Patent: Apr. 4, 2000

[54] PIEZOELECTRIC RESONANCE COMPONENT

[75] Inventor: Hirofumi Funaki, Toyama-ken, Japan

[73] Assignee: Murata Manufacturing Co., Ltd., Japan

[21] Appl. No.: 09/116,353

[22] Filed: Jul. 16, 1998

[30] Foreign Application Priority Data

Aug. 4, 1997 [JP] Japan .................................. 9-208923

[51] Int. Cl.⁷ .............................................. H01L 41/04
[52] U.S. Cl. ................................ 310/354; 310/364
[58] Field of Search ............................ 310/351, 352, 310/354, 364

[56] References Cited

U.S. PATENT DOCUMENTS

| | | | |
|---|---|---|---|
| 4,267,480 | 5/1981 | Kanematsu et al. | 310/366 |
| 4,322,652 | 3/1982 | Otsuka | 310/345 |
| 4,492,892 | 1/1985 | Nakatani | 310/345 |

*Primary Examiner*—Nestor Ramirez
*Assistant Examiner*—Peter Medley
*Attorney, Agent, or Firm*—Graham & James LLP

[57] ABSTRACT

A piezoelectric resonance component is constructed to allow for easy automatic assembly and eliminates a short-circuit between a ring terminal and a dot terminal while achieving excellent performance characteristics at a low material cost. In the piezoelectric resonance component, the piezoelectric resonator is contained in an outer case with a ring-shaped peripheral electrode and a dot-shaped center electrode in contact with one side of a sheet-shaped anisotropic conductor. A plurality of protrusions provided on arm portions of the ring terminal and a protrusion on the dot terminal are in pressure-contact with the other side of the anisotropic conductor. A dimension L1 of the anisotropic conductor in the direction in which the arm portions of the ring terminal are led out is shorter than a distance D1 from the edge of a lead portion of the ring terminal to the end of the arm portions, and the anisotropic conductor is biased toward an inner wall of the outer case.

19 Claims, 4 Drawing Sheets

PIEZOELECTRIC RESONANCE COMPONENT

BACKGROUND OF THE INVENTION

1. Field of the Invention

The present invention relates to a piezoelectric resonance component and, more particularly, to a piezoelectric resonance component used for high frequency apparatuses and other electronic devices.

2. Description of the Related Art

There is a known piezoelectric resonance component of this type having a structure as shown in FIG. 6 (for example, see Japanese examined utility model publication No. S58-34819). This piezoelectric resonance component 15 includes a piezoelectric resonator 2 which is supported by a ring terminal 8, a dot terminal 9 and a ground terminal 12 such that the piezoelectric resonance component 15 can vibrate in an outer case 1. As shown in FIG. 7, the piezoelectric resonator 2 includes a ring-shaped peripheral electrode 4 and a dot-shaped center electrode 5 on one side of a piezoelectric substrate 3 and a ground electrode 6 on the other side of the substrate 3. The center electrode 5 is located inside the peripheral electrode 4.

As shown in FIG. 8, the ring terminal 8 and the dot terminal 9 are disposed such that they face an inner bottom surface of the outer case 1. A lead portion 8a of the ring terminal 8 is provided along one inner wall 1a of the outer case 1. Each of a pair of arm portions 8b vertically extending to the lead portion 8a is bent to provide a triangular protrusion 8c. A lead portion 9a of the dot terminal 9 is provided along an inner wall 1b of the outer case 1 facing the inner wall 1a. A protrusion 9c is provided on a terminal portion 9b which is extended from the lead portion 9a to be located between a pair of arm portions 8a of the ring terminal 8.

The piezoelectric resonator 2 is disposed above the ring terminal 8 and the dot terminal 9 with a sheet-shaped anisotropic conductor 7 interposed therebetween such that the side having the peripheral electrode 4 and the center electrode 5 faces downward. The anisotropic conductor 7 has conductivity in the direction of the thickness thereof but has no conductivity in the direction of the plane thereof. Therefore, the peripheral electrode 4 of the piezoelectric resonator 2 is in electrical conduction to the protrusions 8c of the ring terminal 8 through the anisotropic conductor 7. Similarly, the center electrode 5 of the piezoelectric resonator 2 is in electrical conduction to the protrusion 9c of the dot terminal 9 through the anisotropic conductor 7.

The conventional piezoelectric resonance component 15 has a structure in which the anisotropic conductor 7 has substantially the same size as the piezoelectric resonator 2 and the positions of the center of the anisotropic conductor 7 and the protrusion 9c of the dot terminal 9 substantially coincide with each other. As a result, when the piezoelectric resonator 2 is inclined toward the dot terminal 9 such that an edge of the anisotropic conductor 7 is in contact with the dot terminal 9 as indicated by the alternate long and short dash lines in FIG. 6, the dot terminal 9 is put in conduction to the peripheral electrode 4 of the piezoelectric resonator 2 through the anisotropic conductor 7 and the peripheral electrode 4 is put in conduction to the protrusions 8c of the ring terminal 8 through the anisotropic conductor 7. That is, there has been a problem in that the dot terminal 9 and the ring terminal 8 are short-circuited which results in the piezoelectric resonator not being able to function.

In order to solve this problem, a piezoelectric resonance component has been proposed wherein, as shown in FIG. 9, the anisotropic conductor 7 is replaced with an anisotropic conductor 14 which has an anisotropic conductive region 7a only at a portion thereof where electrical contact is required and has insulating properties in the remaining portions thereof and wherein the anisotropic conductor 14 is provided between the piezoelectric resonator 2 and the dot terminal 9 and between the piezoelectric resonator 2 and the ring terminal 8.

However, in the anisotropic conductor 14 which has conductivity only at a portion thereof which must have conductivity, a problem has arisen in that the material cost has been high because of its special structure. Further, a positional shift of the anisotropic conductor 14 in the outer case 1 could result in non-conductivity between the center electrode 5 of the piezoelectric resonator 2 and the protrusion 9c of the dot terminal 9 and non-conductivity between the peripheral electrode 4 of the piezoelectric resonator 2 and the protrusions 8c of the ring terminal 8. This has resulted in a need for forming the anisotropic conductor 14 to have substantially the same dimensions as those of the resonator-containing portion of the outer case 1 to suppress the positional shift of the anisotropic conductor 14 in the outer case 1. However, when the anisotropic conductor 14 is constructed to have substantially the same dimensions as those of the resonator-containing portion of the outer case 1, it becomes difficult to insert the anisotropic conductor 14 from an opening of the outer case 1 using an automatic assembling apparatus. Further, both of the piezoelectric resonance component using the anisotropic conductor 7 in FIG. 6 and the piezoelectric resonance component using the anisotropic conductor 14 in FIG. 9 have had a problem in that the vibration of the piezoelectric resonator 6 is significantly damped by the anisotropic conductors 7 and 14 which are in contact with the entire surface of the piezoelectric resonator 2.

SUMMARY OF THE INVENTION

To overcome the problems described above, the preferred embodiments of the present invention provide a piezoelectric resonance component which is constructed to allow easy automatic assembly, to prevent a short-circuit between the ring terminal and dot terminal and to provide excellent characteristics at a low material cost.

According to a preferred embodiment of the present invention, there is provided a piezoelectric resonance component including an outer case, a piezoelectric resonator including a peripheral electrode and a center electrode located inside of the peripheral electrode and provided on a first major surface of a piezoelectric substrate and a ground electrode provided on a second major surface of the piezoelectric substrate, an anisotropic conductor disposed in contact with the peripheral electrode and the center electrode on a first major surface thereof, a ring terminal including a lead portion provided along one inner wall of the outer case and a pair of arm portions substantially vertically extending to the lead portion, the arm portions contacting a second major surface of the anisotropic conductor to be electrically connected to the peripheral electrode, a dot terminal including a terminal portion extending between the arm portions of the ring terminal, the terminal portion contacting the second surface of the anisotropic conductor to be electrically connected to the center electrode; and a ground terminal electrically connected to the ground electrode, wherein the piezoelectric resonator is supported between the dot terminal, the ring terminal and the ground terminal such that the resonator can vibrate freely, a dimension L1 of the anisotropic conductor in a direction that is substantially parallel with the arm portions of the ring terminal is shorter than a distance D1 from the edge of the lead portion of the ring terminal to the end of the arm portions of the ring terminal in the direction that is substantially parallel with the arm portions of the ring terminal, and the anisotropic conductor is provided along the one inner wall of the outer case.

According to the above piezoelectric resonance component, the dimension L1 of the anisotropic conductor in the direction that is substantially parallel with the arm portions of the ring terminal is shorter than the distance D1 from the edge of the lead portion of the ring terminal to the end of the arm portions of the ring terminal in the direction that is substantially parallel with the arm portions of the ring terminal, and the anisotropic conductor is provided along one inner wall of the outer case. As a result, the anisotropic conductor is disposed in a position outside of a region where the peripheral electrode of the piezoelectric resonator and the dot terminal face each other. This eliminates the possibility of electrical connection between the dot terminal and the ring terminal through the anisotropic conductor even when the piezoelectric resonator is inclined toward the dot terminal. Further, since the anisotropic conductor contacts only a portion of the piezoelectric resonator and does not contact the entire piezoelectric resonator as in the prior art devices, the piezoelectric resonator is subjected to less damping by the anisotropic conductor, which improves the electrical characteristics of the piezoelectric resonance component.

Further, with the dimension L1 of the anisotropic conductor set shorter than the distance D1, during the operation of inserting the anisotropic conductor in an opening of the outer case using an automatic assembling apparatus, the anisotropic conductor can be moved toward the inner wall by its own weight into the normal biased position by simply moving the center of gravity of the anisotropic conductor toward the ring terminal beyond the positions of the protrusions of the ring terminal and the dot terminal. This allows the accuracy of the positioning of the anisotropic conductor to be set roughly and facilitates automatic insertion. Further, by biasing the anisotropic conductor toward the inner wall at an inclination angle, the position of the center of gravity of the anisotropic conductor can be set lower than the position of the ends of the protrusions of the ring terminal and the dot terminal to prevent the anisotropic conductor from shifting toward the dot terminal.

In the above-described preferred embodiments of the piezoelectric resonance component, the dimension L1 of the anisotropic conductor is preferably greater than about one-half of a distance D2 between the one inner wall and another inner wall which are arranged in a face-to-face relationship.

According to the above structure, the anisotropic conductor provided along one inner wall of the outer case is always interposed between the peripheral electrode of the piezoelectric resonator and the ring terminal and between the center electrode of the piezoelectric resonator and the dot terminal. This makes it possible to reliably establish electrical conduction between the ring terminal and the peripheral electrode and between the dot terminal and the center electrode.

In the above described piezoelectric resonance component, a dimension L2 of the anisotropic conductor in a direction that is substantially parallel to the lead portion of the ring terminal is preferably greater than a dimension D3 from the edge of one of the arm portions of the ring terminal to the edge of the other arm portion in the direction that is substantially parallel to the lead portion of the ring terminal.

According to the above structure, even when there is some shift of the anisotropic conductor from its normal position in the direction that is substantially parallel with the lead portion of the ring terminal, the ring terminal always contacts the anisotropic conductor. This makes it possible to reliably establish electrical conduction between the ring terminal and the peripheral electrode of the piezoelectric resonator.

Other features and advantages of the present invention will become apparent from the following description of preferred embodiments of the invention which refers to the accompanying drawings.

DETAILED DESCRIPTION OF PREFERRED EMBODIMENTS

A preferred embodiment of a piezoelectric resonance component according to the present invention will now be described with reference to the accompanying drawings.

Figure 1:
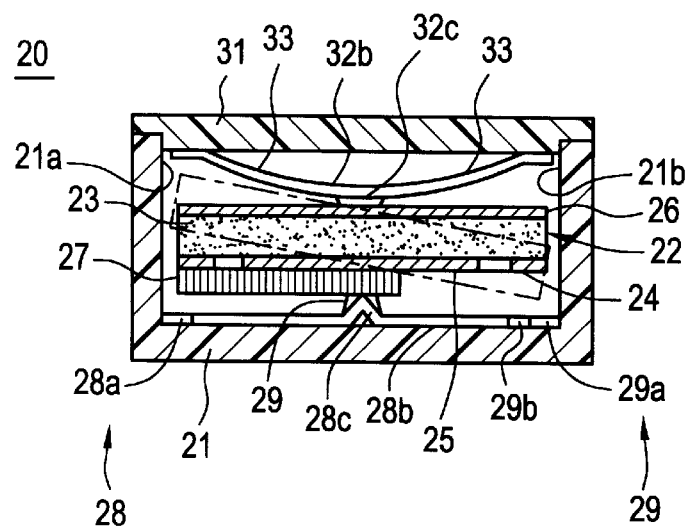
FIG. 1 is a vertical sectional view showing a structure of a preferred embodiment of a piezoelectric resonance component according to the present invention.
Figure 7:
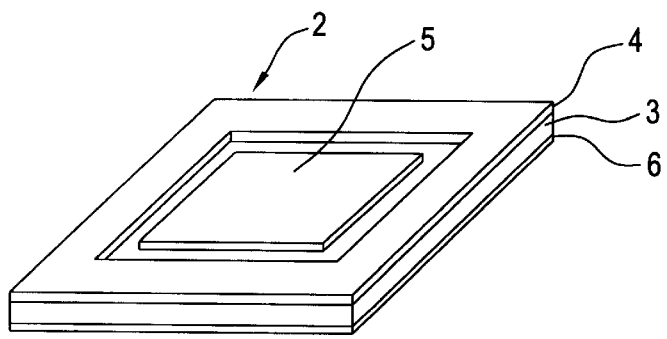
FIG. 7 is a perspective view of a piezoelectric resonator.
Figure 8:
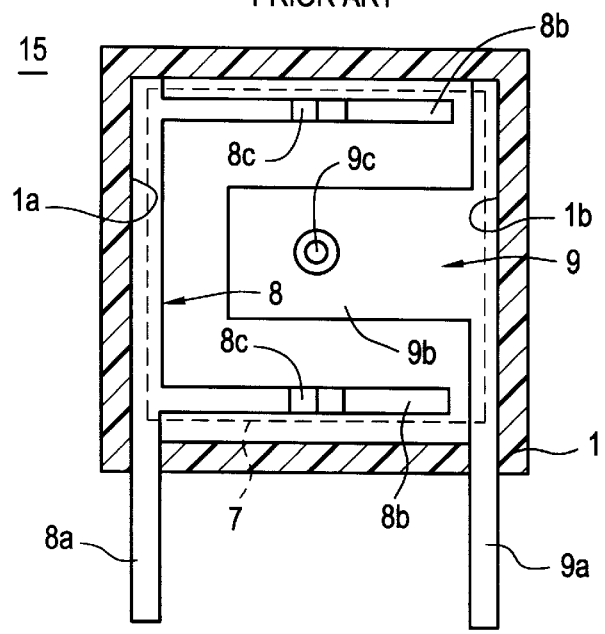
FIG. 8 is a horizontal sectional view showing an arrangement of a ring terminal, a dot terminal and an anisotropic conductor in an outer case of the piezoelectric resonance component shown in FIG. 6.
Figure 9:
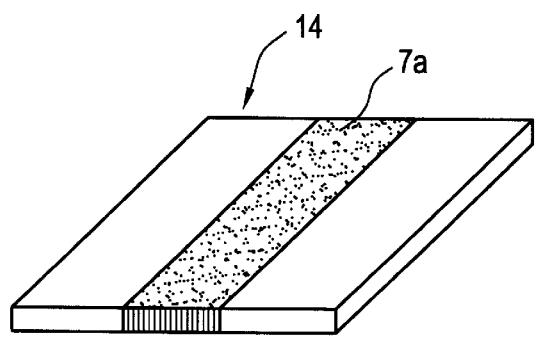
FIG. 9 is a perspective view of another conventional anisotropic conductor.

Referring to FIG. 1, a piezoelectric resonance component 20 includes a piezoelectric resonator 22 which is elastically supported by a ring terminal 28, a dot terminal 29 and a ground terminal 32 such that the resonator 22 can vibrate within an outer case 21 made of a resin material having insulating properties. The piezoelectric resonator 22 is similar to the piezoelectric resonator 2 shown in FIG. 7 and includes a ring-shaped peripheral electrode 24 and a dot-shaped center electrode 25 on a first major surface of a piezoelectric substrate 23 and includes a ground electrode 26 on a second major surface thereof. The peripheral electrode 24 is located at a peripheral region of the piezoelectric substrate 23 and the center electrode 25 is located at a position inside the peripheral electrode 24, i.e., in the center of the piezoelectric substrate 23. The vibration mode of the piezoelectric resonator 22 is preferably a square or disk type vibration mode.

Figure 2:
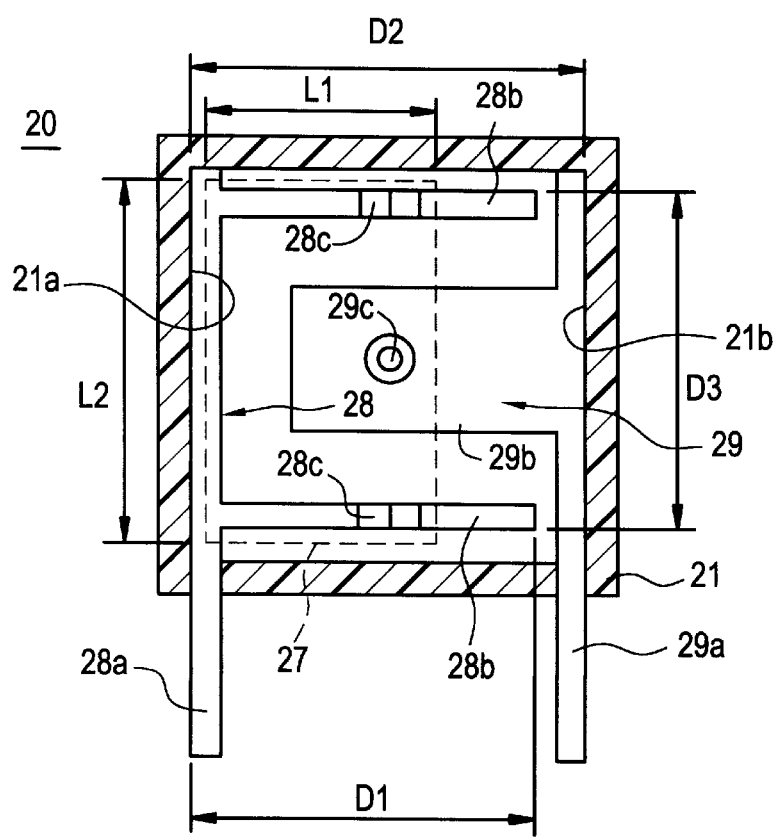
FIG. 2 is a horizontal sectional view showing an arrangement of a ring terminal, a dot terminal and an anisotropic conductor in an outer case of the piezoelectric resonance component shown in FIG. 1.

As shown in FIG. 2, the ring terminal 28 and the dot terminal 29 are disposed such that they face the inner bottom surface of the outer case 21. A lead portion 28a of the ring terminal 28 is provided along one inner wall 21a of the outer case 21. Each of a pair of arm portions 28b vertically led out to the lead portion 28a is bent to define a triangular protrusion 28c. A lead portion 29a of the dot terminal 29 is provided along an inner wall 21b facing the inner wall 21a of the outer case 21. A terminal portion 29b is extended from the lead portion 29a to be located between the pair of arm portions 28b of the ring terminal 28. The terminal portion 29b includes a protrusion 29c.

Figure 3:
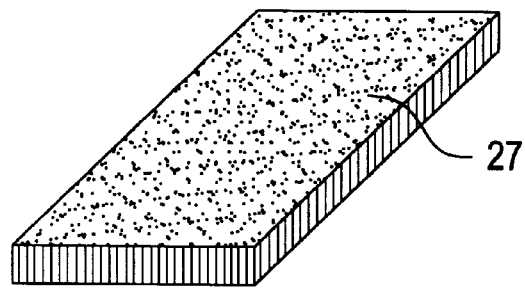
FIG. 3 is a perspective view of the anisotropic conductor used in the piezoelectric resonance component shown in FIG. 1.
Figure 4:
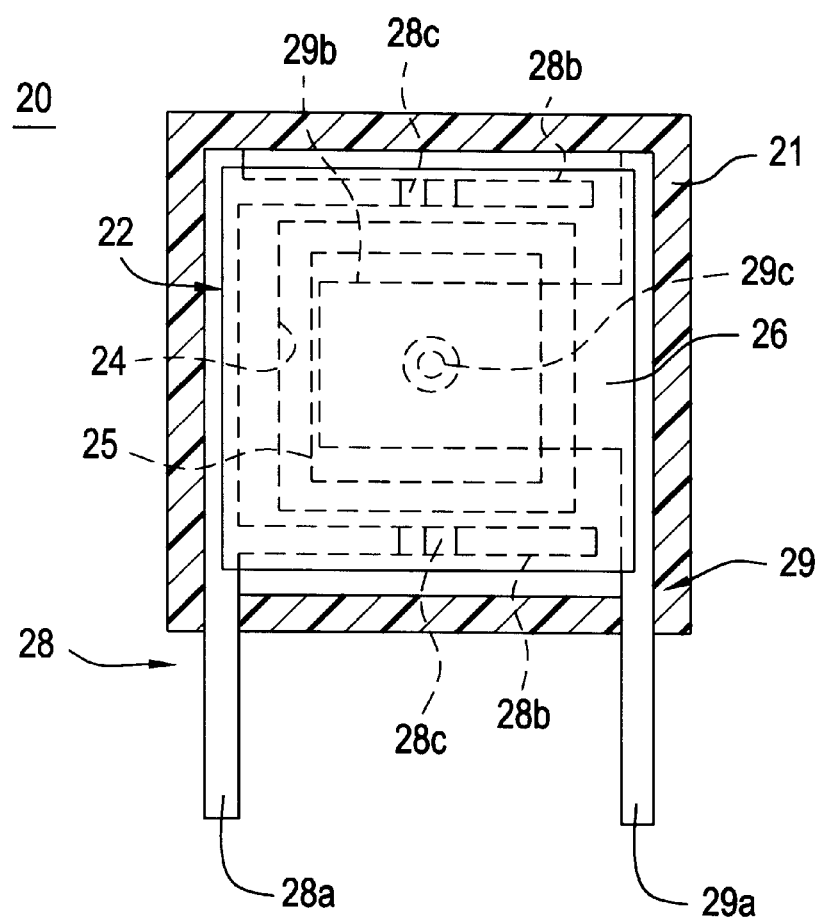
FIG. 4 is a horizontal sectional view showing an arrangement of a ring terminal, a dot terminal and a piezoelectric resonator in an outer case of the piezoelectric resonance component shown in FIG. 1.

The piezoelectric resonator 22 is disposed above the ring terminal 28 and the dot terminal 29 with a sheet-shaped anisotropic conductor 27 as shown in FIG. 3 interposed therebetween such that the side having the peripheral electrode 24 and the center electrode 25 faces downwardly. Specifically, as shown in FIGS. 1 and 4, the peripheral electrode 24 of the piezoelectric resonator 22 is in contact with the upper surface (a first major surface) of the anisotropic conductor 27, and the protrusions 28c of the ring terminal 28 are in contact with the lower surface (a second major surface) of the anisotropic conductor 27 in the region where the peripheral electrode 24 contacts the anisotropic conductor 27. Similarly, the center electrode 25 of the piezoelectric resonator 22 is in contact with the upper surface of the anisotropic conductor 27, and the protrusion 29c of the dot terminal 29 is in contact with the lower surface of the anisotropic conductor 27 in the region where the center electrode 25 contacts the anisotropic conductor 27. The anisotropic conductor 27 is omitted in FIG. 4.

The anisotropic conductor 27 has a property of establishing electrical conduction between particular electrodes in contact with respective positions on the upper and lower surfaces thereof facing each other and only terminals which are to be electrically connected therewith. This property is provided, for example, by burying carbon graphite or metal fine wires in the direction of the thickness of a sheet made of silicon rubber, chloroprene rubber or the like having insulating properties to form the anisotropic conductor 27. As a result of this property and construction of the anisotropic conductor 27, i.e., a property of exhibiting conductivity in the direction of the thickness thereof and no conductivity in the direction of the plane or length or width thereof, the peripheral electrode 24 of the piezoelectric resonator 22 is put in electrical conduction to the protrusions 28c of the ring terminal 28 through the anisotropic conductor 27 and, similarly, the center electrode 25 of the piezoelectric resonator 22 is put in electrical conduction to the protrusion 29c of the dot terminal 29 through the anisotropic conductor 27.

As shown in FIG. 2, a dimension L1 of the anisotropic conductor 27 in a direction that is substantially parallel to the arm portions 28b of the ring terminal 28 is preferably shorter than a distance D1 from the edge of the lead portion 28a of the ring terminal 28 to the end of the arm portions 28b in the direction that is substantially parallel to the arm portions 28b of the ring terminal 28. Further, the anisotropic conductor 27 is provided on the side of the interior of the outer case 21 where the ring terminal 28 is disposed, i.e., it is biased toward the inner wall 21a. Therefore, the anisotropic conductor 27 is located at a position outside the region where the peripheral electrode 24 of the piezoelectric resonator 22 and the dot terminal 29 face each other. This eliminates the possibility of electrical short-circuit between the dot terminal 29 and the ring terminal 28 through the anisotropic conductor 27 even when the piezoelectric resonator 22 is inclined toward the dot terminal 29 as indicated by the alternate long and short dash lines in FIG. 1. Further, since the anisotropic conductor 27 contacts only a part of the piezoelectric resonator 22 and does not extend along a substantially complete area of the resonator 22, the piezoelectric resonator 22 is subjected to less damping by the anisotropic conductor 27, which improves the electrical characteristics of the piezoelectric resonance component 20.

Further, with the dimension L1 of the anisotropic conductor 27 set shorter than the distance D1, during the operation of inserting the anisotropic conductor 27 in an opening of the outer case 21 using an automatic assembling apparatus, the anisotropic conductor 27 can be moved toward the inner wall 21a by force of its own weight into the normal biased position by simply moving the center of gravity of the anisotropic conductor 27 toward the ring terminal 28 beyond the positions of the protrusions 28c of the ring terminal 28 and the protrusion 29c of the dot terminal 29. This allows the accuracy of the positioning of the anisotropic conductor 27 to be set roughly and facilitates automatic insertion. Further, by biasing the anisotropic conductor 27 toward the inner wall 21a at an inclination angle, the position of the center of gravity of the anisotropic conductor 27 can be set lower than the position of the ends of the protrusions 28c and 29c to prevent the anisotropic conductor 27 from shifting toward the dot terminal 29. When the two arm portions 28b have different lengths, the dimension L1 of the anisotropic conductor 27 is set shorter than the distance D1 from the edge of the lead portion 28a of the ring terminal 28 to the end of the shorter arm portion 28b.

The dimension L1 of the anisotropic conductor 27 in the direction that is substantially parallel to the arm portions 28b of the ring terminal 28 is preferably set to be greater than one-half of a distance D2 between the inner wall 21a of the outer case 21 and the inner wall 21b facing the inner wall 21a. Each of the protrusions 28c of the ring terminal 28 and the protrusion 29c of the dot terminal 29 is in a position which is substantially in the middle of the distance D2 between the inner wall 21a of the outer case 21 and the inner wall 21b facing the inner wall 21a. Therefore, the anisotropic conductor 27 provided along the inner wall 21a of the outer case 21 is always interposed between the peripheral electrode 24 of the piezoelectric resonator 22 and the protrusions 28c of the ring terminal 28. Similarly, the anisotropic conductor 27 is always interposed between the center electrode 25 of the piezoelectric resonator 22 and the dot terminal 29. This makes it possible to reliably establish electrical conduction between the ring terminal 28 and the peripheral electrode 24 and between the dot terminal 29 and the center electrode 25.

Further, a dimension L2 of the anisotropic conductor 27 in a direction that is substantially parallel to the lead portion 28a of the ring terminal 28 is set greater than a dimension D3 from the edge of one of the arm portions 28b to the edge of the other arm portion 28b in the direction that is substantially parallel to the lead portion 28a of the ring terminal 28. As a result, even when there is some shift of the anisotropic conductor 27 from its normal position in the direction that is substantially parallel to the lead portion 28a of the ring terminal 28, either of the protrusions 28c of the pair of arm portions 28b contacts the anisotropic conductor 27 without fail. This makes it possible to reliably establish electrical conduction between the ring terminal 28 and the peripheral electrode 24 of the piezoelectric resonator 22.

In the present preferred embodiment, the fibrous conducting elements such as carbon graphite and metal fine wires of the anisotropic conductor 27 are set such that their ends slightly protrude above upper and lower surfaces of the anisotropic conductor 27. This allows the anisotropic conductor 27 to have actual physical point contact with the piezoelectric resonator 22 except at the regions where the conductor 27 is in pressure-contact with the protrusions 28c of the terminal 28 and the protrusion 29c of the terminal 29. As a result, the area of contact between the piezoelectric resonator 22 and the anisotropic conductor 27 allow the amount of damping of the piezoelectric resonator 22 to be reduced further, thereby reducing the insertion loss of the piezoelectric resonance component 20.

Figure 5:
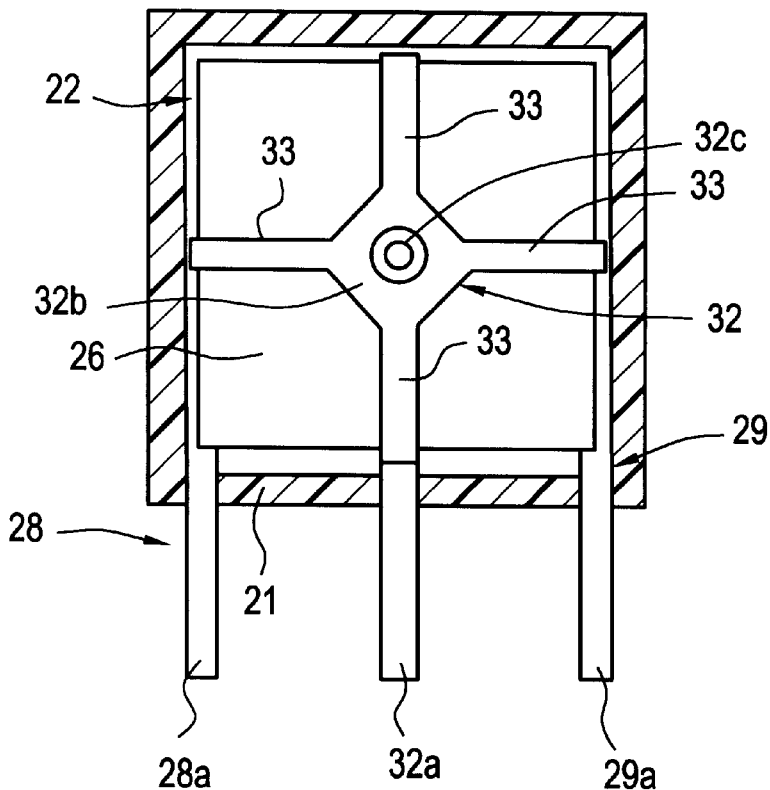
FIG. 5 is a horizontal sectional view showing an arrangement of a ring terminal, a dot terminal, a ground terminal and a piezoelectric resonator in an outer case of the piezoelectric resonance component shown in FIG. 1.
Figure 6:
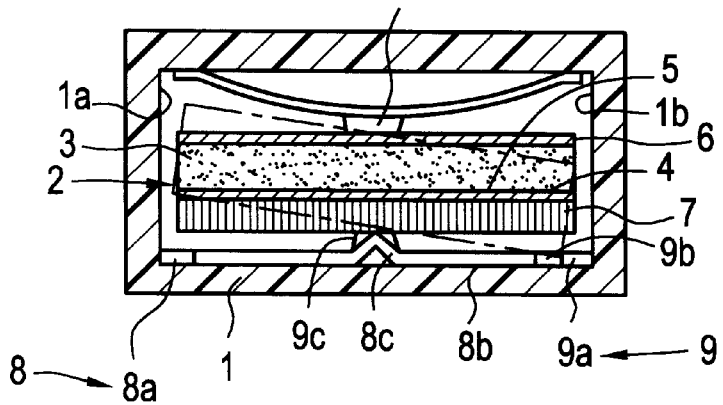
FIG. 6 is a vertical sectional view showing a structure of a conventional piezoelectric resonance component.

As shown in FIGS. 1 and 5, the ground terminal 32 is disposed between a lid member 31 fitted and secured to the opening of the outer case 21 and the piezoelectric resonator 22. The ground terminal 32 preferably includes an electrode portion 32b having four spring strips 33, a lead portion 32a extending from the electrode portion 32b and protrusion 32c located at the electrode portion 32b. The radially extended spring strips 33 are bent toward the piezoelectric resonator 22 to put the protrusion 32c in direct contact with the ground electrode 26 of the piezoelectric resonator 22 by pressure provided by the spring force of the spring strips 33. The lead portion 32a extends to the outside of the outer case 21 along with the lead portion 28a of the ring terminal 28 and the lead portion 29a of the dot terminal 29 on an in-line basis.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonance component, comprising:
   an outer case;
   a piezoelectric resonator having a first major surface and a second major surface and including a peripheral electrode located on the first major surface of the piezoelectric substrate, a center electrode located inside of the peripheral electrode and on the first major surface of the piezoelectric substrate and a ground electrode provided on the second major surface of the piezoelectric substrate;
   an anisotropic conductor in contact with the peripheral electrode and the center electrode at a first major surface of the anisotropic conductor;
   a ring terminal including a lead portion provided along one inner wall of said outer case and a pair of arm portions extending substantially vertically out to the lead portion, each of said pair of arm portions having a first protrusion contacting a second major surface of said anisotropic conductor to be electrically connected to said peripheral electrode;
   a dot terminal including a terminal portion extending between the arm portions of said ring terminal, the terminal portion having a second protrusion contacting the second major surface of said anisotropic conductor to be electrically connected to said center electrode; and
   a ground terminal electrically connected to said ground electrode; wherein said piezoelectric resonator is supported between said second protrusion of said dot terminal, said first protrusion of said ring terminal and said ground terminal such that said piezoelectric resonator can vibrate freely without being hindered;
   a dimension L1 of said anisotropic conductor in a direction that is substantially parallel to the arm portions of said ring terminal is shorter than a distance D1 from the edge of said lead portion of the ring terminal to the end of the arm portions of said ring terminal in the direction that is substantially parallel to the arm portions of said ring terminal, and said anisotropic conductor is arranged between said one inner wall of the outer case and to extend from one longitudinal edge of said piezoelectric resonator to a central portion of said piezoelectric resonator so as to span only partially across said center electrode.

2. The piezoelectric resonance component according to claim 1, wherein the dimension L1 of said anisotropic conductor is greater than one-half of a distance D2 between said one inner wall and another inner wall arranged in a face-to-face relationship with said one inner wall.

3. The piezoelectric resonance component according to claim 2, wherein a dimension L2 of said anisotropic conductor in a direction that is substantially parallel to the lead portion of said ring terminal is greater than a dimension D3 from the edge of one of the arm portions of said ring terminal to the edge of the other arm portion in the direction that is substantially parallel to the lead portion of said ring terminal.

4. The piezoelectric resonance component according to claim 1, wherein a dimension L2 of said anisotropic conductor in a direction that is substantially parallel to the lead portion of said ring terminal is greater than a dimension D3 from the edge of one of the arm portions of said ring terminal to the edge of the other arm portion in the direction that is substantially parallel to the lead portion of said ring terminal.

5. The piezoelectric resonance component according to claim 1, wherein the anisotropic conductor is configured to exhibit conductivity in a direction of thickness thereof and no conductivity in a direction of a length or a width thereof.

6. The piezoelectric resonance component according to claim 1, wherein the anisotropic conductor comprises an insulative sheet and a plurality of carbon graphite or metal fine wires arranged to extend along a direction of thickness of the insulative sheet.

7. The piezoelectric resonance component according to claim 6, wherein the insulative sheet is made of silicon rubber or chloroprene rubber.

8. The piezoelectric resonance component according to claim 1, wherein the anisotropic conductor is located at a position outside a region where the peripheral electrode and the dot terminal face each other.

9. The piezoelectric resonance component according to claim 1, wherein the anisotropic conductor contacts only a portion of the piezoelectric resonator and does not extend along a substantially complete area of the resonator.

10. A piezoelectric resonance component, comprising:
    an outer case;
    a piezoelectric resonator having a first major surface and a second major surface and including a peripheral electrode located on the first major surface of the piezoelectric substrate, a center electrode located inside of the peripheral electrode and on the first major surface of the piezoelectric substrate and a ground electrode provided on the second major surface of the piezoelectric substrate;
    an anisotropic conductor in contact with the peripheral electrode and the center electrode at a first major surface of the anisotropic conductor;
    a ring terminal including a lead portion provided along one inner wall of said outer case and a pair of arm portions extending substantially vertically out to the lead portion, each of said pair of arm portions having a first protrusion contacting a second major surface of said anisotropic conductor to be electrically connected to said peripheral electrode;

a dot terminal including a terminal portion extending between the arm portions of said ring terminal, the terminal portion having a second protrusion contacting the second surface of said anisotropic conductor to be electrically connected to said center electrode; and a ground terminal electrically connected to said ground electrode; wherein said piezoelectric resonator is supported between said second protrusion of said dot terminal, said first protrusion of said ring terminal and said ground terminal such that said piezoelectric resonator can vibrate freely without being hindered;

and said anisotropic conductor is arranged between said one inner wall of the outer case and to extend from one longitudinal edge of said piezoelectric resonator to a central portion of said piezoelectric resonator so as to span only partially across said center electrode.

11. A piezoelectric resonance component according to claim 10, wherein a dimension L1 of said anisotropic conductor in a direction that is substantially parallel to the arm portions of said ring terminal is shorter than a distance D1 from the edge of said lead portion of the ring terminal to the end of the arm portions of said ring terminal in the direction that is substantially parallel to the arm portions of said ring terminal.

12. The piezoelectric resonance component according to claim 11, wherein the dimension L1 of said anisotropic conductor is greater than one-half of a distance D2 between said one inner wall and another inner wall arranged in a face-to-face relationship with said one inner wall.

13. The piezoelectric resonance component according to claim 12, wherein a dimension L2 of said anisotropic conductor in a direction that is substantially parallel to the lead portion of said ring terminal is greater than a dimension D3 from the edge of one of the arm portions of said ring terminal to the edge of the other arm portion in the direction that is substantially parallel to the lead portion of said ring terminal.

14. The piezoelectric resonance component according to claim 11, wherein a dimension L2 of said anisotropic conductor in a direction that is substantially parallel to the lead portion of said ring terminal is greater than a dimension D3 from the edge of one of the arm portions of said ring terminal to the edge of the other arm portion in the direction that is substantially parallel to the lead portion of said ring terminal.

15. The piezoelectric resonance component according to claim 10, wherein the anisotropic conductor is configured to exhibit conductivity in a direction of thickness thereof and no conductivity in a direction of a length or a width thereof.

16. The piezoelectric resonance component according to claim 10, wherein the anisotropic conductor comprises an insulative sheet and a plurality of carbon graphite or metal fine wires arranged to extend along a direction of thickness of the insulative sheet.

17. The piezoelectric resonance component according to claim 16, wherein the insulative sheet is made of silicon rubber or chloroprene rubber.

18. The piezoelectric resonance component according to claim 10, wherein the anisotropic conductor is located at a position outside a region where the peripheral electrode and the dot terminal face each other.

19. The piezoelectric resonance component according to claim 10, wherein the anisotropic conductor contacts only a portion of the piezoelectric resonator and does not extend along a substantially complete area of the resonator.

* * * * *